United States Patent [19]

Egawa

[11] Patent Number: 5,100,332

[45] Date of Patent: Mar. 31, 1992

[54] IC SOCKET

[75] Inventor: Yoshinori Egawa, Tokyo, Japan

[73] Assignee: Yamaichi Electric Mfg. Co., Ltd., Tokyo, Japan

[21] Appl. No.: 635,702

[22] Filed: Dec. 28, 1990

[30] Foreign Application Priority Data

Dec. 28, 1989 [JP] Japan .................................. 1-343784

[51] Int. Cl.$^5$ .............................................. H01R 9/09
[52] U.S. Cl. ...................................... 439/72; 439/331
[58] Field of Search ....................... 439/70, 71, 72, 73, 439/330, 331, 374–377, 525, 526

[56] References Cited

U.S. PATENT DOCUMENTS

| | | | |
|---|---|---|---|
| 3,391,383 | 7/1968 | Antes | 439/331 |
| 4,768,973 | 9/1988 | Bakermans | 439/73 X |
| 4,969,828 | 11/1990 | Bright et al. | 439/73 X |
| 4,984,991 | 1/1991 | Nishimoto | 439/70 |
| 4,986,760 | 1/1991 | Peterson et al. | 439/72 X |
| 5,000,696 | 3/1991 | Matsuoka et al. | 439/331 |

Primary Examiner—Neil Abrams
Assistant Examiner—Khiem Nguyen
Attorney, Agent, or Firm—Wenderoth, Lind & Ponack

[57] ABSTRACT

An IC socket including a socket board having a plurality of contacts on which an IC is to be placed, an IC pressing cover open- and closeably pivotally connected to the socket board, and an IC loading table with the IC loaded thereon, the table being disposed on the socket board and adapted to facilitate a proper contact between the IC and the contacts, the IC socket further including a positioning projection of a generally V-shape formed on the side of the IC pressing cover and a positioning valley of a generally V-shape formed on the side of the IC loading table, the projection and valley being disposed in such a manner as to be corresponded to each other, the generally V-shaped positioning projection being held into the generally V-shaped valley when the IC pressing cover is closed, so that a relative position of the IC pressing cover can be maintained with respect to the IC loading table and IC.

9 Claims, 5 Drawing Sheets

IC SOCKET

BACKGROUND OF THE INVENTION

1. Field of the Invention

This invention relates to an IC socket, in which an IC pressing cover pivotally connected to a socket board provided with a plurality of contacts is closed relative to the socket board, so that an IC loaded on the socket board is pressed by the IC pressing cover to attain a pressure contact with the contacts.

2. Brief Description of the Prior Art

A socket used for mounting an IC package (hereinafter referred to as the "IC") provided with a plurality of IC leads projecting sideward and for a measuring test is designed such that by closing an IC pressing cover pivotally connected to a socket board, the IC leads are urged against contacts to attain a pressure contact therebetween.

Also, there is known a socket of the type in that a socket board is provided with an IC loading table to carry the IC thereon and in that state, IC leads are placed on and contacted with contacts. There is also known a socket of the type in that an IC pressing member is attached to an IC pressing cover in such a manner as to be able to move in the IC pressing direction, and rows of the group of leads projecting sideward are pressed by the IC pressing member with a uniform pressure.

In the IC socket provided with an IC pressing cover pivotally connected thereto as IC pressing means, play or loosening tends to occur to the pivotally connected portion. Therefore, the pressing position of the lead pressing portion of the pressing cover is displaced by the loosening and corresponding contacting parts between the contacts and the leads cannot be pressed properly. IC leads are very fine and minute. Particularly in an IC of the type where leads are bent in two steps (gull-wing type), a contacting point between a contact and a lead is extremely limited. Therefore, if the pressing position is displaced owing to loosening of the cover, there arises such a problem as that the bent step portions are pressed, and the leads and contacts are deformed.

The present invention has been accomplished in view of the above-mentioned problems.

SUMMARY OF THE INVENTION

It is therefore an object of the present invention to provide an IC socket in which contacts and IC leads can properly be contacted with each other even if play and/or loosening occurs to a pivotally connected portion of an IC pressing cover.

To achieve the above object, there is essentially provided an IC socket including a socket board having a plurality of contacts on which an IC is to be placed, an IC pressing cover open- and closeably pivotally connected to said socket board, and an IC loading table with said IC loaded thereon, said table being disposed on said socket board and adapted to facilitate a proper contact between said IC and said contacts, said IC socket further including a positioning projection of a generally V-shape formed on the side of said IC pressing cover and a positioning valley of a generally V-shape formed on the side of said IC loading table, said projection and valley being disposed in such a manner as to be corresponded to each other, said generally V-shaped positioning projection being held into said generally V-shaped valley when said IC pressing cover is closed, so that a relative position of said IC pressing cover can be maintained with respect to said IC loading table and IC. Said generally V-shaped positioning projection may be formed on the side of said IC loading table and said generally V-shaped positioning valley may be formed on the side of said IC pressing cover.

From another aspect of the present invention, there is essentially provided an IC socket including a socket board having a plurality of contacts on which an IC is to be placed, an IC pressing cover open- and closeably pivotally connected to said socket board, an IC pressing member movably attached to said pressing cover for movement in the IC pressing direction, a positioning projection of a generally V-shape formed on the side of said IC pressing cover and a positioning valley of a generally V-shape formed on the side of said IC pressing member, said projection and valley being disposed in such a manner as to be corresponded to each other, said generally V-shaped positioning projection being held into said generally V-shaped valley when said IC pressing cover is closed, so that a relative position of said IC pressing member can be maintained with respect to said socket board and IC. Said generally V-shaped positioning projection may be formed on the side of said IC socket board and said generally V-shaped positioning valley may be formed on the side of said IC pressing member.

From still another aspect of the present invention, there is essentially provided an IC socket including a socket board having a plurality of contacts on which an IC is to be placed, an IC pressing cover open- and closeably pivotally connected to said socket board, an IC pressing member movably attached to said pressing cover for movement in the IC pressing direction, an IC loading table disposed on said socket board, a positioning projection of a generally V-shape formed on the side of said IC pressing member and a positioning valley of a generally V-shape formed on the side of said IC loading table, said projection and valley being disposed in such a manner as to be corresponded to each other, said generally V-shaped positioning projection being held into said generally V-shaped valley when said IC pressing cover is closed, so that a relative position of said IC pressing member can be maintained with respect to said IC loading table and IC. Said generally V-shaped positioning projection may be formed on the side of said IC loading table and said generally V-shaped positioning valley may be formed on the side of said IC pressing member.

According to the present invention, even if displacement occurs to the IC pressing portion of the IC pressing cover when the cover is closed, the displacement of the IC pressing cover is naturally restored or corrected by introducing and holding the generally V-shaped positioning projection into the generally V-shaped valley. As a result, the relative position between the pressing side and the pressed side is properly corrected. As a result, the contacting parts, etc. of the contacts and leads can correctly be pressed to attain a proper pressure contact therebetween.

Furthermore, since the relative position is properly corrected, there can effectively eliminate such an inconvenience as to deform the leads and contacts owing to pressing force applied to unexpected parts of the leads.

The above and other objects and features of the present invention will become more apparent from the following detailed description of the embodiment with reference to the accompanying drawings.

DETAILED DESCRIPTION OF THE EMBODIMENT

Figure 1:
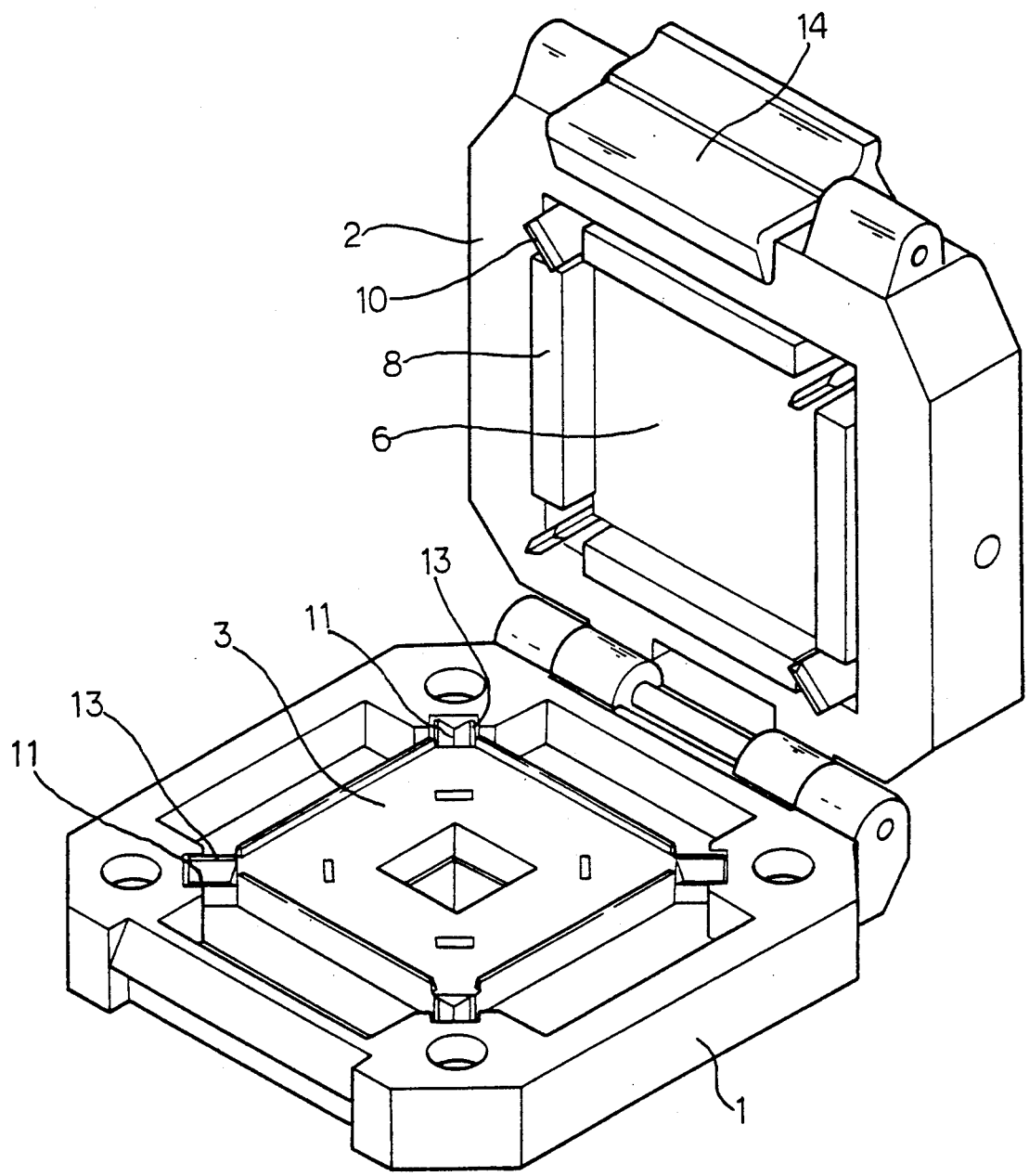
FIG. 1 is a perspective view of an IC socket (contacts are omitted) according to the present invention.
Figure 2:
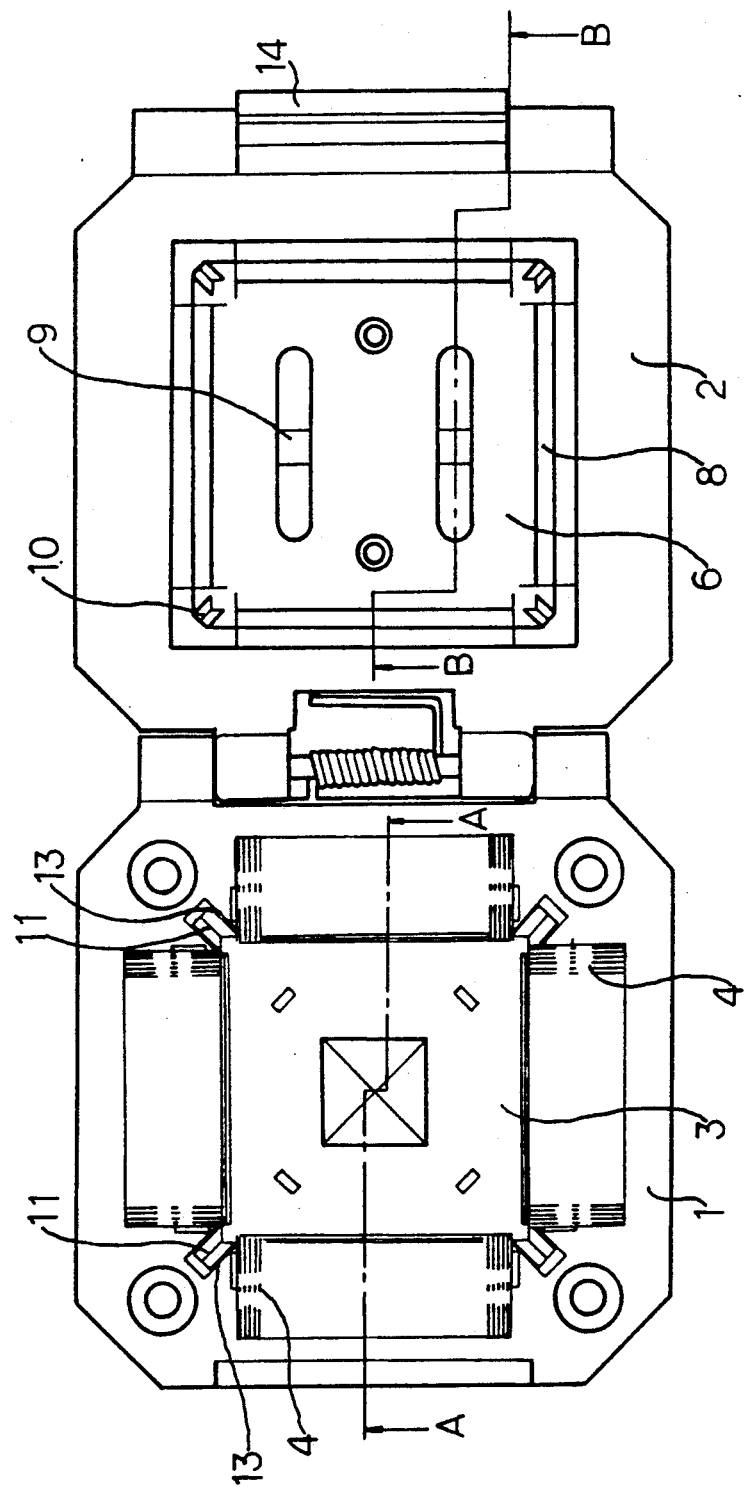
FIG. 2 is a plan view of the above but an IC pressing cover thereof is opened.
Figure 3:
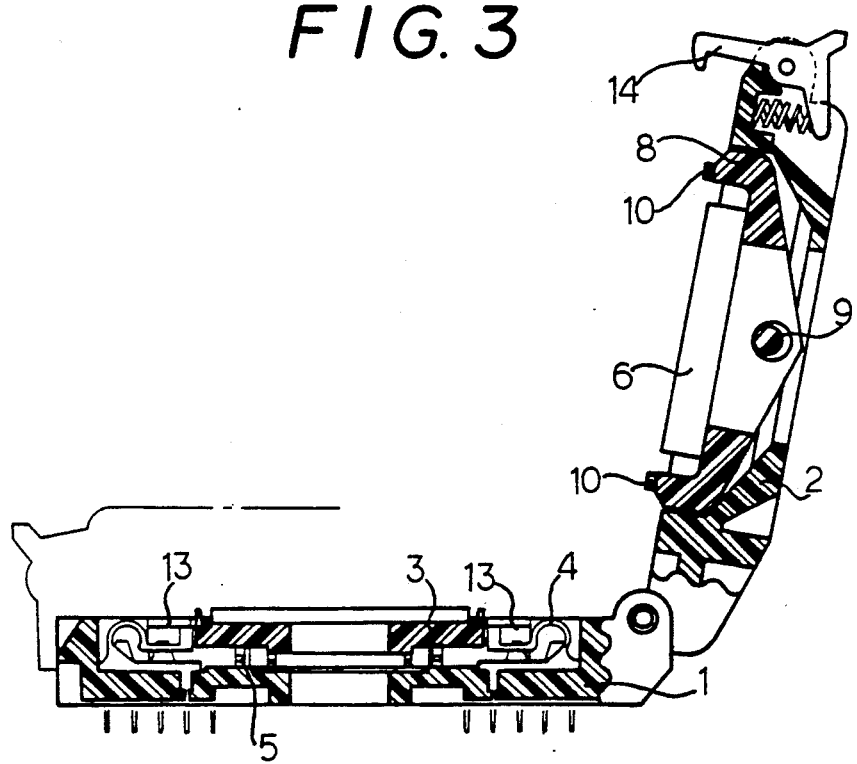
FIG. 3 is a a sectional view taken on lines A—A and B—B of FIG. 2.
Figure 4:
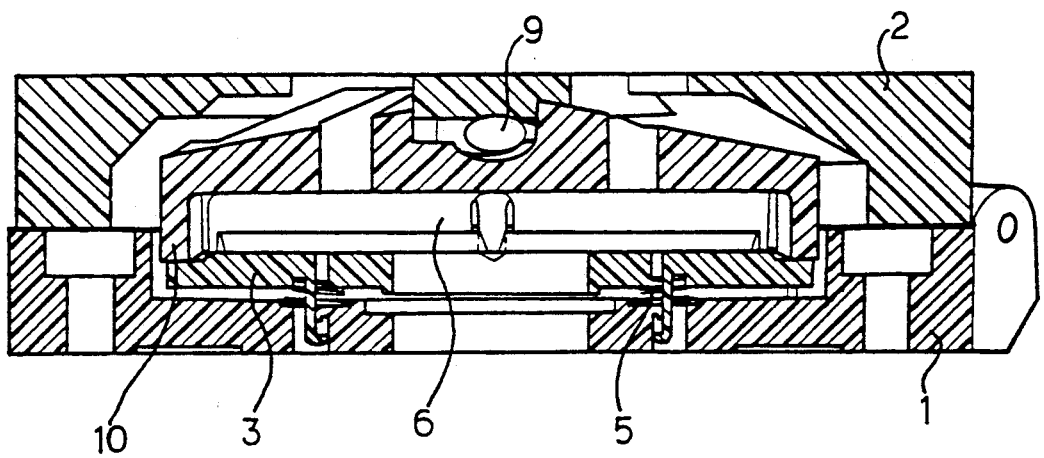
FIG. 4 is a sectional view taken on the diagonal line of an IC loading table when the IC pressing cover is closed.

The embodiment of the present invention will now be described with reference to FIGS. 1 through 8.

The numeral 1 denotes a socket board, and 2 an IC pressing cover pivotally and open- and closeably connected to one end of the socket board 1. The IC pressing cover 2 is provided at its free end with a lock lever 14 for maintaining a closed state of the IC pressing cover 2 relative to the socket board 1. The socket board 1 is provided with an IC loading table 3. A plurality of contacts 4 are arranged in parallel relation on two sides or four sides of the periphery of the IC loading table 3.

The IC loading table 3 is resiliently held on the socket board 1 through a spring 5 such that the table 5 can be moved upward and downward. The IC loading table 5 is moved downward against the biasing force of the spring 5 and moved upward in accordance with the biasing force to keep a raised position.

On the other hand, an IC pressing member 6 is movably attached to the IC pressing cover 2 for movement in the IC pressing direction, and an IC pressing pad 8 for pressing the IC leads 7 per each row integrally projects from the IC pressing member 6.

As means for movably attaching the IC pressing member 6 to the IC pressing cover 2, the IC pressing member 6 spreading to the developing area of the IC leads 7 is disposed to an inner surface of the IC pressing surface 2, and a central portion of the IC pressing member 6 is pivotally supported on the pressing cover 2 through a shaft 9 such that the IC pressing member 6 can be idly moved. Owing to the foregoing arrangement, the pressing member 6 is allowed to idly move about the shaft 9 by a proper amount upwardly and downwardly, forwardly and backwardly, and leftwardly and rightwardly.

The IC pressing member 6 is pivotally supported by the IC pressing cover 2 through ball joints, etc. such that the member 6 can be idly moved in free directions or otherwise the IC pressing member 6 is pivotally supported by the shaft 9 such that the member 6 can be pivoted leftwardly and rightwardly or forwardly and backwardly.

Positioning projections 10 of a generally V-shape are formed on the side of such constructed IC pressing member 6, and positioning valleys 11 of a generally V-shape are formed on the side of the IC loading table 3 such that the projections and valleys are corresponded with each other. When the IC pressing cover 2 is closed, the generally V-shaped positioning projections 10 are held into the generally V-shaped positioning valleys 11 in order to maintain the relative position of the IC pressing member 6 with respect to the IC loading table 3 and IC 12.

Otherwise, the generally V-shaped positioning projections 10 are formed on the side of the IC loading table 3, and the generally V-shaped positioning valleys 11 are formed on the side of the IC pressing member 6.

Furthermore, as another alternative example, the IC pressing cover 2 (not shown) is not provided with the pressing member 6, the generally V-shaped positioning projections 10 are formed on the side of the IC pressing cover 2, and the generally V-shaped valleys are formed on the side of the IC loading table 3 such that the projections 10 and the valleys 11 are corresponded with each other. When the IC pressing cover 2 is closed, the generally V-shaped positioning projections 10 are held into the generally V-shaped valleys 11 in order to maintain a relative position of the IC pressing cover 2 with respect to the IC loading table 3 and IC 12. The IC pressing pad 8 is integrally formed to the IC pressing cover 2.

Alternatively, the generally V-shaped positioning projections 10 are formed on the side of the IC loading table 3, and the generally V-shaped positioning valleys 11 are formed on the side of the IC pressing cover 2.

As still another alternative example, the generally V-shaped positioning projections 10 are formed on the side of the IC pressing member 6 attached to the IC pressing cover 2, the socket board 1 (not shown) is not provided with the IC loading table 3 and the generally V-shaped positioning valleys 10 are formed on the side of the board 1 such that the projections 11 and the valleys 11 are corresponded with each other. When the IC pressing cover 2 is closed, the generally V-shaped positioning projections 10 are held into the generally V-shaped positioning valleys 11 in order to maintain a relative position of the IC pressing member with respect to the socket board 1 and IC 12.

Also, the generally V-shaped positioning projections 10 are formed on the side of the socket board 1 and the generally V-shaped positioning valleys 11 are formed on the side of the IC pressing member 6.

As one preferred embodiment of the generally V-shaped positioning projections 10 or the generally V-shaped positioning valleys 11 formed on the respective parts, positioning projecting pieces 13 project from each of two pairs of opposite corner portions or one pair of opposite corner portions of the rectangular IC loading table 3 along the diagonal lines, and the generally V-shaped positioning valleys 11 are formed on upper surfaces of the projecting pieces 13. The projecting pieces 13 are also functioned as guide means for the upward and downward movement of the IC loading table 3. Also, the corner portions of the IC loading table 3 are served as dead spaces between the respective adjacent rows. The spaces are used to allow the projecting pieces 13 to project therethrough and to effectively perform positioning at each corner portion.

In case the IC loading table 3 is not employed, the generally V-shaped positioning projections 10 or the generally V-shaped positioning valleys 11 are integrally formed on the socket board 1 in position in accordance with the above-mentioned example.

Similarly, as one preferred embodiment, the generally V-shaped positioning projections 10 or the generally V-shaped positioning valleys 11 are arranged at each corner portion or at a pair of opposite corner portions of the IC pressing portion 6 in such a manner as to be corresponded to the valleys 11 or projections 10.

In case the IC pressing member 6 is not employed, the generally V-shaped positioning projections 10 or the generally V-shaped positioning valleys 11 are integrally formed with the IC pressing cover 2 in position in accordance with the above-mentioned example.

In this way, when the IC pressing cover 2 is closed relative to the socket board 1, the generally V-shaped positioning projections 10 formed on one side is held into the generally V-shaped positioning valleys 11 formed on the other side. As a result, a relative position between the projections 10 and the valleys 11 is established so as to provide a proper pressure to the leads 7 and the contacts 4.

Figure 5:
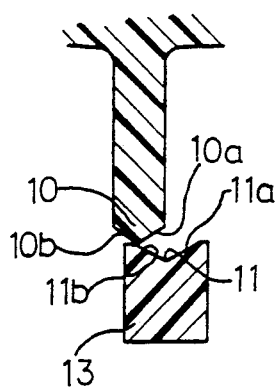
FIGS. 5(A), 5(B), 6(A) and 6(B) are sectional views showing the correlation among a generally V-shaped positioning valley, a generally V-shaped positioning projection and an IC pressing portion (for instance, IC pressing pad), the former shows a state right before holding the projection into the valley, and the latter shows a state after the projection is already held into the valley.
Figure 5:
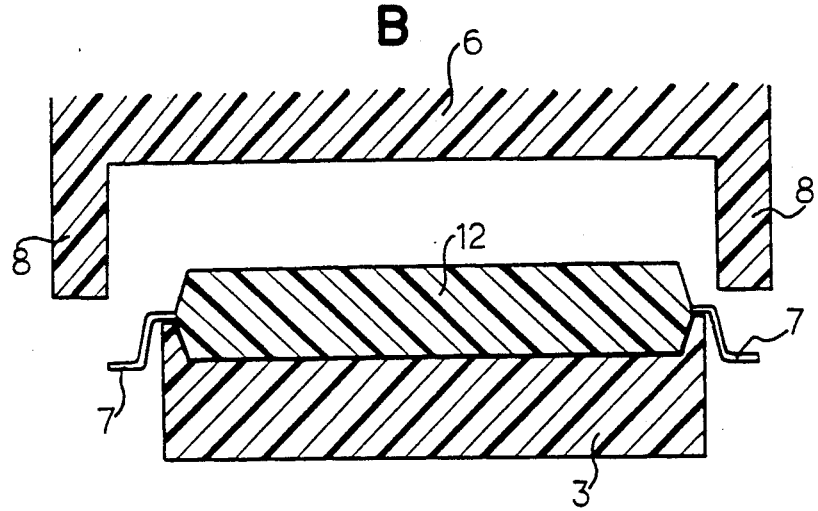
Figure 6:
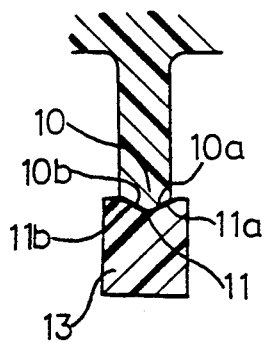
Figure 6:
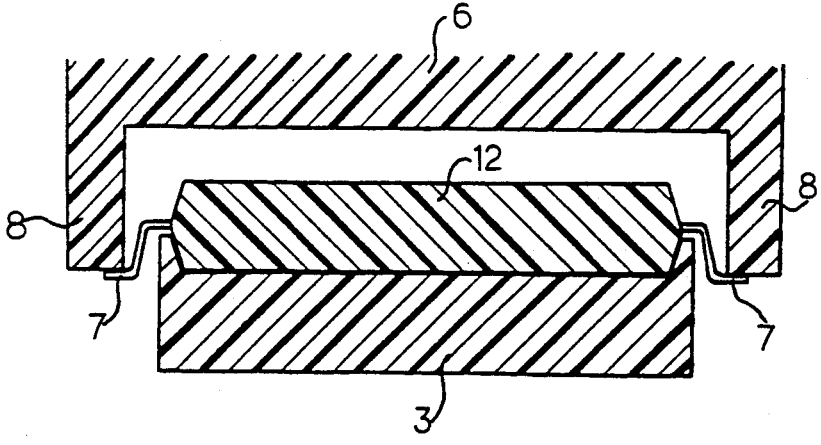

In case a positional displacement occurs to the IC pressing pad 8 on the side of the IC pressing cover 2 or the IC pressing member 6 as a result of generation of play at the pivotally connected portion of the cover 2, as is shown in FIGS. 5 and 6, the inclined surfaces 10a and 10b of the generally V-shaped positioning projections 10 inclining in the centripetal direction generate slip guided by the inclined surfaces 11a and 11b of the generally v-shaped positioning valleys 11 inclining in the centripetal direction and guided to a centripetal position to ensure a proper pressing position.

In case the IC loading table 3 is disposed on the socket board 1, the IC loading table 3 and the pressing member 6 are moved in the horizontal direction so that the generally V-shaped positioning projections 10 are held into the generally V-shaped positioning valleys 11.

Also, when the generally V-shaped positioning projections 10 are held into the generally V-shaped positioning valleys 11, one presses the other to lower the IC loading table 3 with the IC 12 carried thereon against the biasing force of the spring 5, the IC pressing pad 8 presses the IC leads 7 placed on and contacted to the contacts 4 to obtain the above-mentioned pressure contact at a time differential. That is, the projections 10 and the valleys 11 press the IC loading table 3 first and then, the IC pressing pad 8 presses the leads 7.

Figure 7:
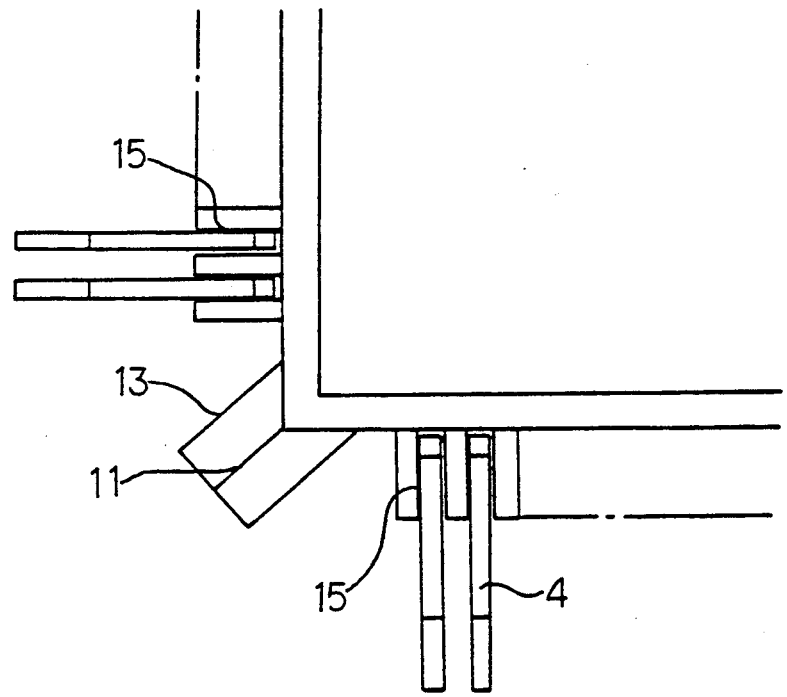
FIG. 7 is a plan view showing the relation between an IC loading table and contacts according to another embodiment of the present invention.
Figure 8:
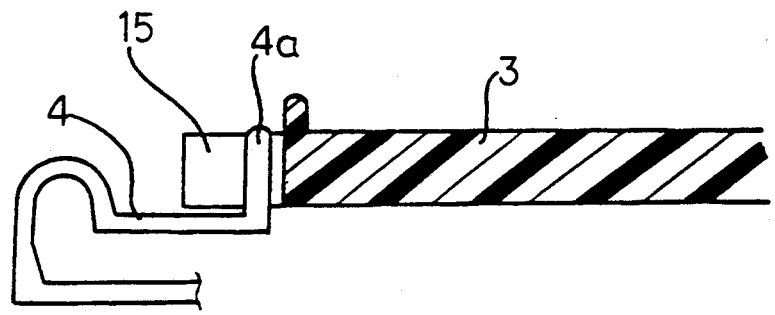
FIG. 8 is a sectional view of the above.

Furthermore, the present invention includes another embodiment, in which in the above-mentioned embodiment, the contacting portions 4a of the front ends of the contacts 4, as shown in FIGS. 7 and 8, are engaged with the peripheral portion of the IC loading table 3 so that the contacting portions 4a can be displaced sidewardly in accordance with the horizontal movement of the IC loading table 3. For example, a plurality of slots 15 or holes are arranged in parallel relation on two or four sides of the peripheral portions of the IC loading table 3 and the contacting portions 4a of the front ends of the contacts 4 are inserted into the respective slots 15 in order to obtain a following movement between the IC loading table 3 and the contacts 4.

As described in the foregoing, according to the present invention, even if displacement occurs to the IC pressing portion as a result of generation of play at the pivotally connected portion of the IC pressing cover, the displacement of the IC pressing cover is restored or corrected by introducing and holding the generally V-shaped positioning projection into the generally V-shaped valley. As a result, the relative position between the pressing side and the pressed side is properly corrected. As a result, the contacting parts of the contacts and leads can correctly be pressed by the pressing cover or the lead pressing portion of the pressing member disposed to the cover to attain a proper pressure contact therebetween.

Furthermore, since the relative position is properly corrected, there can effectively eliminate such an inconvenience as to deform the leads and contacts owing to pressing force applied to unexpected parts of the leads.

Although several embodiments have been described, the present invention is of course not limited to these embodiments. Many changes and modifications can be made within the scope of the appended claims.

What is claimed is:

1. An IC socket, comprising:
   a substantially rectangular-shaped socket board having a plurality of contacts on which an IC is to be placed;
   a substantially rectangular-shaped IC pressing cover openably and closably pivotally connected to said socket board; and
   an IC loading table adapted to have an IC loaded thereon, said table being disposed on said socket board and adapted to facilitate a proper contact between the contacts of an IC and said socket board contacts;
   one of said loading table and said pressing cover having at least two positioning projections of a generally V-shape thereon, one at each of two diagonally opposite corners of the socket board and pressing cover, and the other of said loading table and said pressing cover having at least two positioning valleys of a generally V-shape therein at corresponding diagonally opposite corners, said projections and valleys being in mating opposed relation to each other, said projections having a ridge line at the apex thereof and said valleys having a bottom line at the apex thereof, said ridge lines and bottom lines lying at an angle to the sides of said loading table and pressing cover, whereby when said pressing cover is closed, the projections are urged into said valleys for bringing the pressing cover and loading table into register with respect to an IC on the loading table.

2. An IC socket as claimed in claim 1 wherein said projections are on said pressing cover and said valleys are in said socket board.

3. An IC socket as claimed in claim 1 wherein said projections are on said socket board and said valleys are in said pressing cover.

4. An IC socket, comprising:
   a substantially rectangular-shaped socket board having a plurality of contacts on which an IC is to be placed;
   a substantially rectangular-shaped IC pressing cover openably and closably pivotally connected to said socket board; and
   an IC pressing member movably attached to said pressing cover for movement in the IC pressing direction;
   one of said socket board and said pressing member having at least two positioning projections of a generally V-shape thereon, one at each of two diagonally opposite corners of the socket board and pressing cover, and the other of said socket board and said pressing member having at least two positioning valleys of a generally V-shape therein at corresponding diagonally opposite corners, said projections and valleys being in mating opposed relation to each other, said projections having a ridge line at the apex thereof and said valleys having a bottom line at the apex thereof, said ridge lines and bottom lines lying at an angle to the sides of said socket board and pressing member, whereby when said pressing cover is closed, the projections are urged into said valleys for bringing the pressing cover and pressing member and socket board into register with respect to an IC in the socket.

5. An IC socket as claimed in claim 4 in which said projections are on said IC socket board and said valleys are in said pressing member.

6. An IC socket as claimed in claim 4 in which said projections are on said pressing member and said valleys are in said IC socket board.

7. An IC socket, comprising:
- a substantially rectangular-shaped socket board having a plurality of contacts on which an IC is to be placed;
- a substantially rectangular-shaped IC pressing cover openably and closably pivotally connected to said socket board; and
- an IC pressing member movably attached to said pressing cover for movement in the IC pressing direction; and
- an IC loading table adapted to have an IC loaded thereon and disposed on said socket board and adapted to facilitate a proper contact between the contacts of an IC thereon and said socket board contacts;
- one of said pressing member and said loading table having at least two positioning projections of a generally V-shape thereon, one at each of two diagonally opposite corners of the rectangular shaped socket board and pressing cover, and the other of said pressing member and loading table having at least two positioning valleys of a generally V-shape therein at corresponding diagonally opposite corners, said projections and valleys being in mating opposed relation to each other, said projections having a ridge line at the apex thereof and said valleys having a bottom line at the apex thereof, said ridge lines and bottom lines lying at an angle to the sides of said pressing member and loading table, whereby when said pressing cover is closed, the projections are urged into said valleys for bringing the pressing cover and pressing member and loading table into register with respect to an IC on the loading table.

8. An IC socket as claimed in claim 7 in which said projections are on said pressing member and said valleys are in said loading table.

9. An IC socket as claimed in claim 7 in which said projections are on said loading table and said valleys are in said pressing member.

* * * * *